(12) United States Patent
Do et al.

(10) Patent No.: US 9,312,194 B2
(45) Date of Patent: Apr. 12, 2016

(54) INTEGRATED CIRCUIT PACKAGING SYSTEM WITH TERMINALS AND METHOD OF MANUFACTURE THEREOF

(75) Inventors: Byung Tai Do, Singapore (SG); Arnel Senosa Trasporto, Singapore (SG); Linda Pei Ee Chua, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 73 days.

(21) Appl. No.: 13/424,968

(22) Filed: Mar. 20, 2012

(65) Prior Publication Data

US 2013/0249077 A1 Sep. 26, 2013

(51) Int. Cl.
*H01L 23/28* (2006.01)
*H01L 23/31* (2006.01)
*H01L 23/495* (2006.01)
*H01L 21/48* (2006.01)
*H01L 25/10* (2006.01)

(52) U.S. Cl.
CPC ............ *H01L 23/28* (2013.01); *H01L 21/4832* (2013.01); *H01L 23/49548* (2013.01); *H01L 23/49582* (2013.01); *H01L 25/105* (2013.01); *H01L 23/3107* (2013.01); *H01L 2224/16225* (2013.01); *H01L 2224/32225* (2013.01); *H01L 2224/32245* (2013.01); *H01L 2224/48227* (2013.01); *H01L 2224/48247* (2013.01); *H01L 2224/73265* (2013.01); *H01L 2224/92247* (2013.01); *H01L 2225/1023* (2013.01); *H01L 2225/1058* (2013.01); *H01L 2225/1088* (2013.01); *H01L 2924/15311* (2013.01); *H01L 2924/15331* (2013.01)

(58) Field of Classification Search
None
See application file for complete search history.

(56) References Cited

U.S. PATENT DOCUMENTS

| | | | |
|---|---|---|---|
| 5,976,912 A | 11/1999 | Fukutomi et al. | |
| 6,238,952 B1 | 5/2001 | Lin | |
| 7,049,177 B1 | 5/2006 | Fan et al. | |
| 7,060,535 B1 * | 6/2006 | Sirinorakul | H01L 21/4832 257/702 |
| 7,087,462 B1 | 8/2006 | Park et al. | |
| 7,344,920 B1 | 3/2008 | Kirloskar et al. | |
| 7,605,459 B2 | 10/2009 | Mok et al. | |
| 7,662,672 B2 | 2/2010 | Lin | |
| 7,790,500 B2 * | 9/2010 | Ramos | H01L 21/4832 257/676 |
| 7,836,586 B2 | 11/2010 | Bayan et al. | |
| 7,858,443 B2 | 12/2010 | Powell et al. | |
| 8,084,299 B2 * | 12/2011 | Tan | H01L 21/4832 257/666 |
| 2002/0041022 A1 | 4/2002 | Sakamoto et al. | |
| 2004/0063252 A1 | 4/2004 | Takahashi | |
| 2008/0067649 A1 | 3/2008 | Matsunaga et al. | |
| 2008/0303134 A1 | 12/2008 | Li et al. | |
| 2009/0087953 A1 * | 4/2009 | Lin | H01L 21/4828 438/123 |
| 2010/0178734 A1 * | 7/2010 | Lin | H01L 21/4828 438/123 |
| 2010/0224971 A1 | 9/2010 | Li | |
| 2011/0079886 A1 * | 4/2011 | Bathan | H01L 21/4832 257/676 |
| 2012/0139104 A1 * | 6/2012 | Camacho | H01L 21/4832 257/737 |

\* cited by examiner

*Primary Examiner* — Steven Loke
*Assistant Examiner* — Juanita Rhodes
(74) *Attorney, Agent, or Firm* — Ishimaru & Associates LLP

(57) ABSTRACT

A method of manufacture of an integrated circuit packaging system includes: providing a leadframe having a mounting platform; applying an attach layer on the mounting platform; mounting an integrated circuit die on the attach layer; forming an encapsulation on the integrated circuit die and the attach layer, the mounting platform exposed from the encapsulation; and forming a terminal having a terminal protrusion from the leadframe, the terminal protrusion below a horizontal plane of the mounting platform.

8 Claims, 6 Drawing Sheets

INTEGRATED CIRCUIT PACKAGING SYSTEM WITH TERMINALS AND METHOD OF MANUFACTURE THEREOF

CROSS-REFERENCE TO RELATED APPLICATION(S)

The present application contains subject matter related to concurrently filed U.S. patent application Ser. No. 13/425,277, now U.S. Pat. No. 8,569,112. The related application is assigned to STATS ChipPAC Ltd. and the subject matter thereof is incorporated herein by reference thereto.

TECHNICAL FIELD

The present invention relates generally to an integrated circuit packaging system, and more particularly to a system with terminals.

BACKGROUND ART

The integrated circuit package is the building block used in a high performance electronic system to provide applications for usage in products such as automotive vehicles, pocket personal computers, cell phone, intelligent portable military devices, aeronautical spacecraft payloads, and a vast line of other similar products that require small compact electronics supporting many complex functions.

A small product, such as a cell phone, can contain many integrated circuit packages, each having different sizes and shapes. Each of the integrated circuit packages within the cell phone can contain large amounts of complex circuitry. The circuitry within each of the integrated circuit packages work and communicate with other circuitry of other integrated circuit packages using electrical connections.

Products must compete in world markets and attract many consumers or buyers in order to be successful. It is very important for products to continue to improve in features, performance, and reliability while reducing product costs, product size, and to be available quickly for purchase by the consumers or buyers.

The amount of circuitry and the amount of electrical connections inside a product are key to improving the features, performance, and reliability of any product. Furthermore, the ways the circuitry and electrical connections are implemented can determine the packaging size, packaging methods, and the individual packaging designs. Attempts have failed to provide a complete solution addressing simplified manufacturing processing, smaller dimensions, lower costs due to design flexibility, increased functionality, leveragability, and increased IO connectivity capabilities.

Thus, a need still remains for an integrated circuit system improved yield, thermal cooling, low profile, and improved reliability. In view of the ever-increasing commercial competitive pressures, along with growing consumer expectations and the diminishing opportunities for meaningful product differentiation in the marketplace, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system, including: providing a leadframe having a mounting platform; applying an attach layer on the mounting platform; mounting an integrated circuit die on the attach layer; forming an encapsulation on the integrated circuit die and the attach layer, the mounting platform exposed from the encapsulation; and forming a terminal having a terminal protrusion from the leadframe, the terminal protrusion below a horizontal plane of the mounting platform.

The present invention provides an integrated circuit packaging system, including: a mounting platform; an integrated circuit die mounted on the mounting platform; a terminal having a terminal protrusion, the terminal protrusion below a horizontal plane of the mounting platform; and an encapsulation formed on the integrated circuit die and the attach layer, the mounting platform exposed from the encapsulation.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
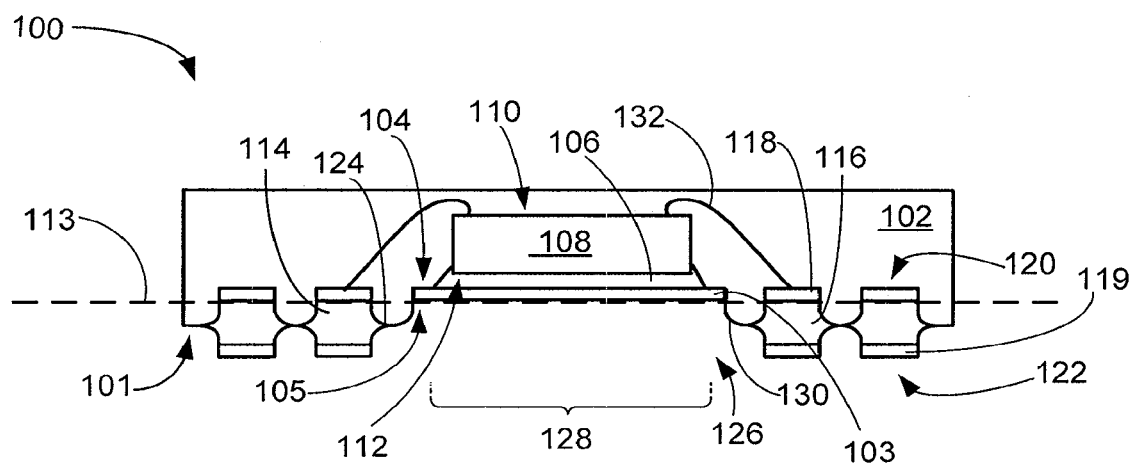
FIG. 1 is a cross-sectional view of the integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

The term "processing" as used herein includes deposition of material or photoresist, patterning, exposure, development, etching, cleaning, and/or removal of the material or photoresist as required in forming a described structure. The term "active side" refers to a side of a die, a module, a package, or an electronic structure having active circuitry fabricated thereon or having elements for connection to the active circuitry within the die, the module, the package, or the electronic structure.

For expository purposes, the term "horizontal" as used herein is defined as a plane parallel to the active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" is defined as meaning there is direct contact between elements or components with no intervening material.

Figure 2:
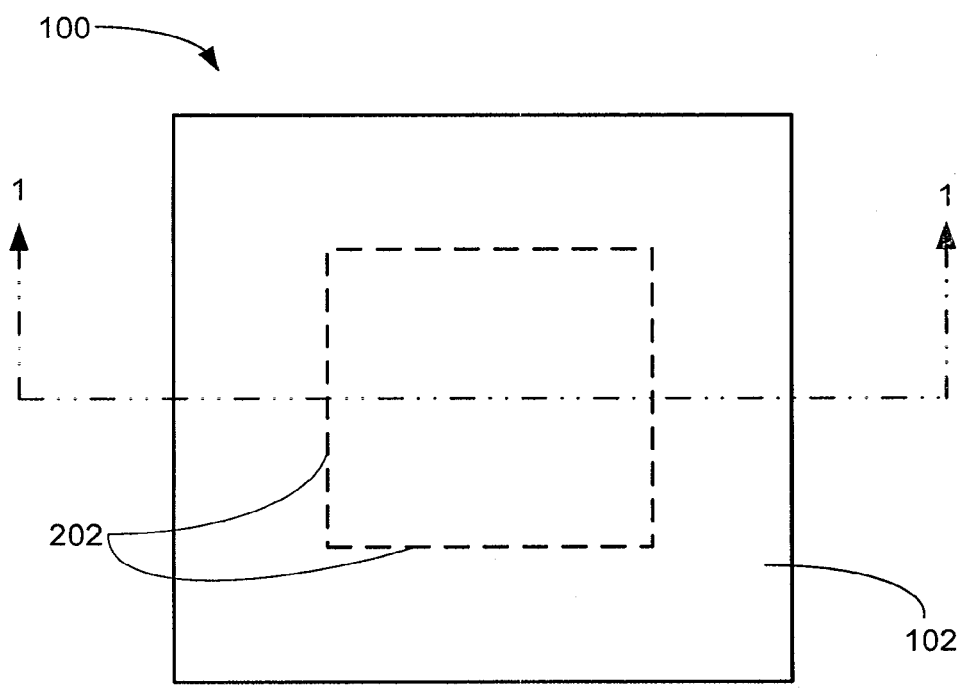
FIG. 2 is a top view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 is shown having an encapsulation 102, a mounting platform 103, an integrated circuit die 108, and a terminal 114.

The encapsulation 102 covers the mounting platform 103, the integrated circuit die 108, and the terminal 114 and provides mechanical protection, environmental protection, and a hermetic seal for the integrated circuit packaging system 100. The encapsulation 102 can be made from an epoxy molding compound (EMC), film assisted molding, polyimide compound, or a wire-in-film (WIF), as examples. The encapsulation 102 can include an encapsulation bottom surface 101.

The integrated circuit packaging system 100 can include the mounting platform 103, which is defined as a structure for mounting components, dies, and devices. The mounting platform 103 can be made from metals including gold, silver, nickel, other conductive metal, or a combination thereof as examples.

The mounting platform 103 can include a platform top side 104 and a platform bottom side 105 opposite to the platform top side 104. The platform top side 104 of the mounting platform 103 can be embedded in the encapsulation 102. The integrated circuit die 108 can be mounted on the platform top side 104. An entire area of the platform bottom side 105, having dimensions greater than the integrated circuit die 108, can be exposed from the encapsulation 102. A horizontal plane 113 is coplanar with the platform bottom side 105 of the mounting platform 103.

An attach layer 106 can be applied to the platform top side 104 of the mounting platform 103. The attach layer 106 can include a die attach adhesive, an adhesive tape, an adhesive film, a thermally conductive material, an epoxy paste, or other adhesive as examples. The integrated circuit die 108 can be mounted to the mounting platform 103 using the attach layer 106. The attach layer 106 completely covers the non-active side 112 of the into rated circuit die 108.

The integrated circuit die 108 is embedded in the encapsulation 102. The integrated circuit die 108 is shown as a wire-bonded chip as an example. The integrated circuit die 108 can have an active side 110 and have a non-active side 112 opposite the active side 110. The non-active side 112 of the integrated circuit die 108 faces the mounting platform 103.

The terminal 114 can be formed in a number of rows surrounding and spaced from the integrated circuit die 108 and the mounting platform 103. As an example, a plurality of the terminal 114 is shown in two rows surrounding the integrated circuit die 108. The terminal 114 can include a terminal body 116, a top terminal layer 118, and a bottom terminal layer 119.

The terminal body 116 provides the base structure of the terminal 114 on which the top terminal layer 118 and the bottom terminal layer 119 can be formed. The terminal body 116 can be made from a variety of materials including copper, tin, zinc, other conductive metals, or metal alloy.

The top terminal layer 118 and the bottom terminal layer 119 can be formed on the terminal body 116. The top terminal layer 118 and the bottom terminal layer 119 can be made from metals including gold, silver, nickel, other conductive metal, or a combination thereof as examples.

The terminal 114 can include a terminal top side 120 and a terminal bottom side 122 opposite to the terminal top side 120. The top terminal layer 118 can be formed at the terminal top side 120 of the terminal body 116. The bottom terminal layer 119 can be formed at the terminal bottom side 122 of the terminal body 116. The top terminal layer 118 can be coplanar with the mounting platform 103 as an example of the variable height configurations of the mounting platform 103.

The terminal body 116 can include a terminal protrusion 124 on a non-horizontal side of the terminal body 116. The terminal protrusion 124 extends from the top terminal layer 118 at the terminal top side 120 and extends from the bottom terminal layer 119 at the terminal bottom side 122 to form a tip at the non-horizontal side of the terminal body 116. The terminal protrusion 124 is shown below the horizontal plane 113 of the mounting platform 103.

The encapsulation 102 can include an encapsulation cavity 126. The encapsulation cavity 126 can expose the mounting platform 103 from the encapsulation 102. The encapsulation cavity 126 can have a cavity horizontal dimension 128, which is defined as the length and the width of the encapsulation cavity 126. The cavity horizontal dimension 128 can be greater than the length and the width of the integrated circuit die 108. For example, the encapsulation cavity 126 is shown having horizontal dimensions greater than the horizontal dimensions of the integrated circuit die 108.

The encapsulation cavity 126 can also have horizontal dimensions equal to the horizontal dimensions of the integrated circuit die 108. For example, the cavity horizontal dimension 128 can also be longer than the length of the integrated circuit die 108. The encapsulation cavity 126 can be bounded by a cavity sidewall 130 on a non-horizontal side of the encapsulation 102.

The cavity sidewall 130 can include a planar portion and a non-planar portion extending from the planar portion. The planar portion of the cavity sidewall 130 can be perpendicular to the horizontal plane 113. The non-planar portion can have a curved contour or grooved contour as the shape of the cavity sidewall 130. The contour of the cavity sidewall 130 can have characteristics of being formed from an etching process such as the concave contour extending from the planar portion to the terminal protrusion 124. The terminal protrusion 124 at the terminal bottom side 122 can extend to the encapsulation cavity 126 along the cavity sidewall 130.

The integrated circuit packaging system 100 can include a chip interconnect 132. The chip interconnect 132 provides an electrical connection and can include a bond wire, a solder ball, or a solder pillar as examples. The chip interconnect 132 can connect the top terminal layer 118 at the terminal top side 120 to the active side 110 of the integrated circuit die 108. The chip interconnect 132 provides electrical connectivity from the terminal 114 to the integrated circuit die 108.

It has been discovered that the exposure of the mounting platform 103 from the encapsulation 102 provides airflow and cooling for the integrated circuit die 108. The encapsulation cavity 126 provides the platform bottom side 105 with exposure from the encapsulation 102. The integrated circuit packaging system 100 is thermally enhanced and the integrated circuit die 108 is cooled through the mounting platform 103 and the empty space provided by the encapsulation cavity 126.

Further, it has been discovered that the configuration of the terminal protrusion 124 below the horizontal plane 113 of the mounting platform 103 further decreases package profile and increases airflow to the mounting platform 103. The placement of the mounting platform 103 in the encapsulation 102 also provides a variable height for the encapsulation cavity 126, which allows the integrated circuit die 108 and the mounting platform 103 to be spaced further from substrates and packages mounted to the terminal 114. The space created by the encapsulation cavity 126 provides space for increased airflow and package space for other components and devices.

Referring now to FIG. 2, therein is shown a top view of the integrated circuit packaging system 100. The integrated circuit packaging system 100 is shown having the encapsulation 102. For illustrative purposes, dash lines show the outline of the integrated circuit die 108 of FIG. 1 under the encapsulation 102. The integrated circuit die 108 can include a die horizontal dimension 202, which is defined as the length and the width of the integrated circuit die 108.

Figure 3:
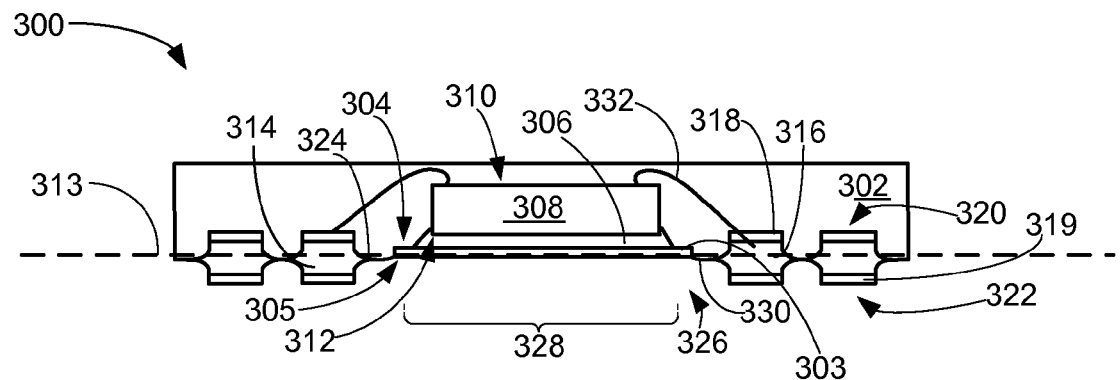
FIG. 3 is a cross-sectional view of an integrated circuit packaging system exemplified by the top view of FIG. 2 taken along line 1-1 of FIG. 2 in a second embodiment of the present invention.

Referring now to FIG. 3, therein is shown a cross-sectional view of an integrated circuit packaging system 300 exemplified by the top view of FIG. 2 taken along line 1-1 of FIG. 2 in a second embodiment of the present invention. The integrated circuit packaging system 300 is shown having an encapsulation 302, a mounting platform 303, an integrated circuit die 308, and a terminal 314.

The encapsulation 302 covers the mounting platform 303, the integrated circuit die 308, and the terminal 314 and provides mechanical protection, environmental protection, and a hermetic seal for the integrated circuit packaging system 300. The encapsulation 302 can be made from an epoxy molding compound (EMC), film assisted molding, polymide compound, or a wire-in-film (WIF), as examples.

The integrated circuit packaging system 300 can include the mounting platform 303, which is defined as a structure for mounting components, dies, and devices. The mounting platform 303 can be made from metals including gold, silver, nickel, other conductive metal, or a combination thereof as examples.

The mounting platform 303 can include a platform top side 304 and a platform bottom side 305 opposite to the platform top side 304. The platform top side 304 of the mounting platform 303 can be embedded in the encapsulation 302. The integrated circuit die 308 can be mounted on the platform top side 304. The platform bottom side 305 can be exposed from the encapsulation 302. A horizontal plane 313 is coplanar with the platform bottom side 305 of the mounting platform 303.

An attach layer 306 can be applied to the platform top side 304 of the mounting platform 303. The attach layer 306 can include a die attach, an adhesive tape, an adhesive film, a thermally conductive material, an epoxy paste, or other adhesive as examples. The integrated circuit die 308 can be mounted to the mounting platform 303 using the attach layer 306.

The integrated circuit die 308 is embedded in the encapsulation 302. The integrated circuit die 308 is shown as a wire-bonded chip as an example. The integrated circuit die 308 can have an active side 310 and have a non-active side 312 opposite the active side 310. The non-active side 312 of the integrated circuit die 308 faces the mounting platform 303.

The terminal 314 can be formed in a number of rows surrounding and spaced from the integrated circuit die 308 and the mounting platform 303. As an example, a plurality of the terminal 314 is shown in two rows surrounding the integrated circuit die 308. The terminal 314 can include a terminal body 316, a top terminal layer 318, and a bottom terminal layer 319.

The terminal body 316 provides the base structure of the terminal 314 on which the top terminal layer 318 and the bottom terminal layer 319 can be formed. The terminal body 316 can be made from a variety of materials including copper, tin, zinc, other conductive metals, or metal alloy.

The top terminal layer 318 and the bottom terminal layer 319 can be formed on the terminal body 316. The top terminal layer 318 and the bottom terminal layer 319 can be made from metals including gold, silver, nickel, other conductive metal, or a combination thereof as examples.

The terminal 314 can include a terminal top side 320 and a terminal bottom side 322 opposite to the terminal top side 320. The top terminal layer 318 can be formed at the terminal top side 320 of the terminal body 316. The bottom terminal layer 319 can be formed at the terminal bottom side 322 of the terminal body 316. The top terminal layer 318 can be above the horizontal plane 113 of FIG. 1 of the mounting platform 103 as an example of the variable height configurations of the mounting platform 303.

The terminal body 316 can include a terminal protrusion 324 on a non-horizontal side of the terminal body 316. The terminal protrusion 324 extends from the top terminal layer 318 at the terminal top side 320 and extends from the bottom terminal layer 319 at the terminal bottom side 322 to form a tip at the non-horizontal side of the terminal body 316. The terminal protrusion 324 is shown below the horizontal plane 313 of the mounting platform 303.

The encapsulation 302 can include an encapsulation cavity 326. The encapsulation cavity 326 can expose the mounting platform 303 from the encapsulation 302. The encapsulation cavity 326 can have a cavity horizontal dimension 328, which is defined as the length and the width of the encapsulation cavity 326. The cavity horizontal dimension 328 can be greater than the length and the width of the integrated circuit die 308. For example, the encapsulation cavity 326 is shown having horizontal dimensions greater than the horizontal dimensions of the integrated circuit die 308.

The encapsulation cavity 326 can also have horizontal dimensions equal to the horizontal dimensions of the integrated circuit die 308. For example, the cavity horizontal dimension 328 can also be longer than the length of the integrated circuit die 308. The encapsulation cavity 326 can be bounded by a cavity sidewall 330 on a non-horizontal side of the encapsulation 302.

The cavity sidewall 330 can include a non-planar portion. The non-planar portion can have a curved shape or grooved shape as the contour of the cavity sidewall 330. The contour of the cavity sidewall 330 can have characteristics of being formed from an etching process such as a curved or concave contour extending from the terminal protrusion 324 to the mounting platform 303. The terminal protrusion 324 at the terminal bottom side 322 can extend to the encapsulation cavity 326 along the cavity sidewall 330.

The integrated circuit packaging system 300 can include a chip interconnect 332. The chip interconnect 332 provides an electrical connection and can include a bond wire, a solder ball, or a solder pillar as examples. The chip interconnect 332 can connect the top terminal layer 318 at the terminal top side 320 to the active side 310 of the integrated circuit die 308. The chip interconnect 332 provides electrical connectivity from the terminal 314 to the integrated circuit die 308.

It has been discovered that the exposure of the mounting platform 303 from the encapsulation 302 provides airflow and cooling for the integrated circuit die 308. The encapsulation cavity 326 provides the platform bottom side 305 with exposure from the encapsulation 302. The integrated circuit packaging system 300 is thermally enhanced and the integrated circuit die 308 is cooled through the mounting platform 303 and the empty space provided by the encapsulation cavity 326.

It has been discovered that the configuration of the terminal protrusion 324 below the horizontal plane 313 of the mounting platform 303 further increases airflow to the mounting platform 303. The placement of the mounting platform 303 in the encapsulation 302 also provides a variable height for the encapsulation cavity 326, which allows the integrated circuit die 308 and the mounting platform 303 to be spaced further from substrates and packages mounted to the terminal 314. The space created by the encapsulation cavity 326 provides space for increased airflow and package space for other components and devices.

It has been discovered that the height of the mounting platform 303 with the terminal protrusion 324 below the horizontal plane 313 provides for chip cooling, for a lower package profile, and for shorter wire-loops for the chip interconnect 332. The positioning of the mounting platform 303 can be between the top terminal layer 318 and the terminal protrusion 324 for increased cooling because the mounting platform 303 has more exposure from the encapsulation 302. The height of the mounting platform 303 provides a shorter distance between the integrated circuit die 308 and the top terminal layer 318 for shorter wire-loops, which increases the reliability of the electrical connection.

Figure 4:
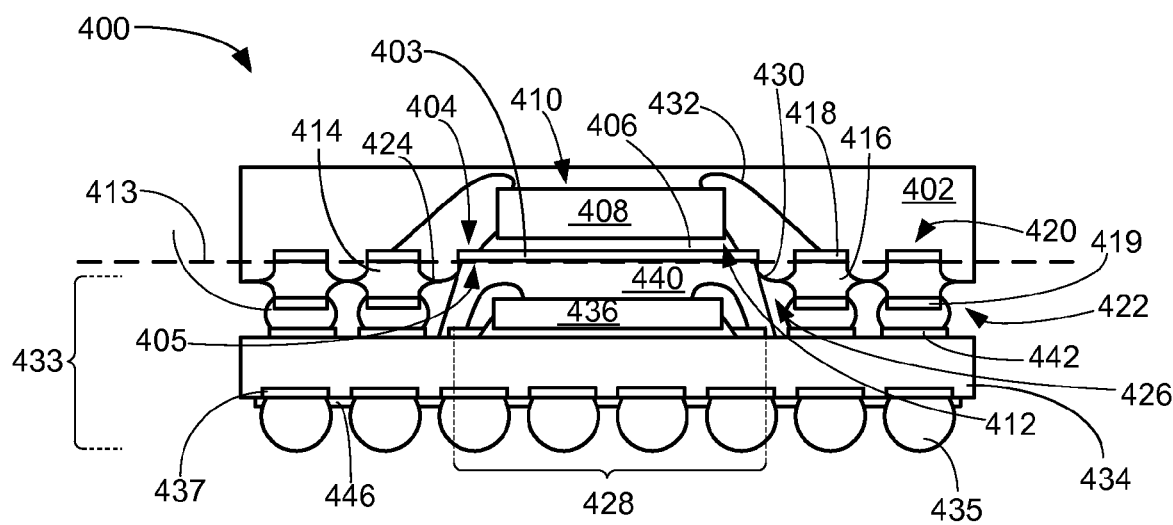
FIG. 4 is a cross-sectional view of an integrated circuit packaging system exemplified by the top view of FIG. 2 taken along line 1-1 of FIG. 2 in a third embodiment of the present invention.

Referring now to FIG. 4, therein is shown a cross-sectional view of an integrated circuit packaging system 400 exemplified by the top view of FIG. 2 taken along line 1-1 of FIG. 2 in a third embodiment of the present invention. The integrated circuit packaging system 400 can stack the integrated circuit packaging system 100 of FIG. 1 in a configuration for a package-on-package system.

The integrated circuit packaging system 400 is shown having an encapsulation 402, a mounting platform 403, an integrated circuit die 408, and a terminal 414. The encapsulation 402 covers the mounting platform 103, the integrated circuit die 408, and the terminal 414 and provides mechanical protection, environmental protection, and a hermetic seal for the integrated circuit packaging system 400. The encapsulation 402 can be made from an epoxy molding compound (EMC), film assisted molding, polymide compound, or a wire-in-film (WIF), as examples.

The integrated circuit packaging system 400 can include the mounting platform 403, which is defined as a structure for mounting components, dies, and devices. The mounting platform 403 can be made from metals including gold, silver, nickel, other conductive metal, or a combination thereof as examples.

The mounting platform 403 can include a platform top side 404 and a platform bottom side 405 opposite to the platform top side 404. The platform top side 404 of the mounting platform 403 can be embedded in the encapsulation 402. The integrated circuit die 408 can be mounted on the platform top side 404. The platform bottom side 405 can be exposed from the encapsulation 402. A horizontal plane 413 is coplanar with the platform bottom side 405 of the mounting platform 403.

An attach layer 406 can be applied to the platform top side 404 of the mounting platform 403. The attach layer 406 can include a die attach adhesive, an adhesive tape, an adhesive film, a thermally conductive material, an epoxy paste, or other adhesive as examples. The integrated circuit die 408 can be mounted to the mounting platform 403 using the attach layer 406.

The integrated circuit die 408 is embedded in the encapsulation 402. The integrated circuit die 408 is shown as a wire-bonded chip as an example. The integrated circuit die 408 can have an active side 410 and have a non-active side 412 opposite the active side 410. The non-active side 412 of the integrated circuit die 408 faces the mounting platform 403.

The terminal 414 can be formed in a number of rows surrounding and spaced from the integrated circuit die 408 and the mounting platform 403. As an example, a plurality of the terminal 414 is shown in two rows surrounding the integrated circuit die 408. The terminal 414 can include a terminal body 416, a top terminal layer 418, and a bottom terminal layer 419.

The terminal body 416 provides the base structure of the terminal 414 on which the top terminal layer 418 and the bottom terminal layer 419 can be formed. The terminal body 416 can be made from a variety of materials including copper, tin, zinc, other conductive metals, or metal alloy.

The top terminal layer 418 and the bottom terminal layer 419 can be formed on the terminal body 416. The top terminal layer 418 and the bottom terminal layer 419 can be made from metals including gold, silver, nickel, other conductive metal, or a combination thereof as examples.

The terminal 414 can include a terminal top side 420 and a terminal bottom side 422 opposite to the terminal top side 420. The top terminal layer 418 can be formed at the terminal top side 420 of the terminal body 416. The bottom terminal layer 419 can be formed at the terminal bottom side 422 of the terminal body 416. The top terminal layer 418 can be coplanar with the mounting platform 403 as an example of the variable height configurations of the mounting platform 403.

The terminal body 416 can include a terminal protrusion 424 on a non-horizontal side of the terminal body 416. The terminal protrusion 424 extends from the top terminal layer 418 at the terminal top side 420 and extends from the bottom terminal layer 419 at the terminal bottom side 422 to form a tip at the non-horizontal side of the terminal body 416. The terminal protrusion 424 is shown below the horizontal plane 413 of the mounting platform 403.

The encapsulation 402 can include an encapsulation cavity 426. The encapsulation cavity 426 can expose the mounting platform 403 from the encapsulation 402. The encapsulation cavity 426 can have a cavity horizontal dimension 428, which is defined as the length and the width of the encapsulation cavity 426. The cavity horizontal dimension 428 can be greater than the length and the width of the integrated circuit die 408. For example, the encapsulation cavity 426 is shown having horizontal dimensions greater than the horizontal dimensions of the integrated circuit die 408.

The encapsulation cavity 426 can also have horizontal dimensions equal to the horizontal dimensions of the integrated circuit die 408. For example, the cavity horizontal dimension 428 can also be longer than the length of the integrated circuit die 408. The encapsulation cavity 426 can be bounded by a cavity sidewall 430 on a non-horizontal side of the encapsulation 402.

The cavity sidewall 430 can include a planar portion and a non-planar portion extending from the planar portion. The planar portion of the cavity sidewall 430 can be perpendicular to the horizontal plane 413. The non-planar portion can have a curved contour or grooved contour as the shape of the cavity sidewall 430. The contour of the cavity sidewall 430 can have characteristics of being formed from an etching process such as the concave contour extending from the planar portion to the terminal protrusion 424. The terminal protrusion 424 at the terminal bottom side 422 can extend to the encapsulation cavity 426 along the cavity sidewall 430.

The integrated circuit packaging system 400 can include a chip interconnect 432. The chip interconnect 432 provides an electrical connection and can include a bond wire, a solder ball, or a solder pillar as examples. The chip interconnect 432 can connect the top terminal layer 418 at the terminal top side 420 to the active side 410 of the integrated circuit die 408. The chip interconnect 432 provides electrical connectivity from the terminal 414 to the integrated circuit die 408.

The bottom terminal layer 419 at the terminal bottom side 422 can be mounted to a base package 433. The base package 433 can include a base substrate 434, a system interconnect 435, and a base integrated circuit die 436. The base package 433 can include a very fine-pitched ball grid array (VFBGA).

The base substrate 434 can provide structural support and connectivity for other components and devices. The base substrate 434 can include a system contact pad 437 on a top surface of the base substrate 434. The base substrate 434 can include a mount contact pad 438 on a side of the base substrate 434 opposite to the system contact pad 437.

The base substrate 434 can include a solder mask 446 formed on the bottom surface of the base substrate 434. The solder mask 446 can include a polymer material, an epoxy material, or a dry film material as examples. The system contact pad 437 can be exposed from the solder mask 446.

The system interconnect 435 can be attached to the system contact pad 437 on the bottom surface of the base substrate 434 for attaching the base package 433 to the next level system (not shown). The system interconnect 435 can include solder balls, solder dots, solder pillars, or a conductive bump as examples.

A mount interconnect 442 can attach the terminal 414 to the base substrate 434. The mount interconnect 442 provides a direct electrical and mechanical connection between the terminal 414 and the base substrate 434. The mount interconnect 442 can include solder paste, solder dots, or a conductive bump.

The base integrated circuit die 436 can be mounted to the base substrate 434. The base integrated circuit die 436 is shown as a wire-bond chip although the base integrated circuit die 436 can also be a flip chip. The base integrated circuit die 436 can be mounted to the base substrate 434 with an adhesive layer. The base integrated circuit die 436 can be electrically connected to the base substrate 434 through interconnects such as bond wires.

A base encapsulation 440 can cover the base integrated circuit die 436. The base encapsulation 440 is shown only covering the base integrated circuit die 436 with the terminal 414 not in contact with the base encapsulation 440 and a portion of the base substrate 434 exposed from the base encapsulation 440. The base encapsulation 440 is shown having a length and a width substantially equal to the length and width of the integrated circuit die 408. The top surface of the base encapsulation 440 can be positioned within the encapsulation cavity 426 with the integrated circuit die 408 suspended over the base encapsulation 440.

The base encapsulation 440 is shown having sloped sidewalls although it is understood that the base encapsulation 440 can have other configurations for the sidewalls. For example, the sidewalls of the base encapsulation 440 can be orthogonal and can be perpendicular to the base substrate 434. The base encapsulation 440 is shown in direct contact with the mounting platform 403, although it is understood that there can be a space between the base encapsulation 440 and the mounting platform 403. The encapsulation 402, the integrated circuit die 408, the terminal 414, and the base package 433 can form a package-on-package (PoP) device.

It has been discovered that the exposure of the mounting platform 403 from the encapsulation 402 provides airflow and cooling for the integrated circuit die 408. The encapsulation cavity 426 provides the platform bottom side 405 with exposure from the encapsulation 402. The integrated circuit packaging system 400 is thermally enhanced and the integrated circuit die 408 is cooled through the mounting platform 403 and the empty space provided by the encapsulation cavity 426.

Further, it has been discovered that the configuration of the terminal protrusion 424 below the horizontal plane 413 of the mounting platform 403 further increases airflow to the mounting platform 403. The placement of the mounting platform 403 in the encapsulation 402 also provides a variable height for the encapsulation cavity 426, which allows the integrated circuit die 408 and the mounting platform 403 to be spaced further from substrates and packages mounted to the terminal 414 for increased airflow and cooling.

Further, it has been discovered that the horizontal and vertical dimensions of the encapsulation cavity 426 and the placement of the mounting platform 403 in the encapsulation 402 leverages additional space in package-on-package applications. For example, the configuration of the terminal protrusion 424 below the horizontal plane 413 of the mounting platform 403 provides for variable platform heights that allow different sized base chips and components, such as the base integrated circuit die 436 to fit in the encapsulation cavity 426. Further, the integrated circuit die 408 can share the same substrate as the base package 433 reducing package footprint and profile size. Further, the cavity horizontal dimension 428 provides for different sized components, dies, and packages that can be fitted into the encapsulation cavity 426.

It has also been discovered that the contour of the cavity sidewall 430 provides for more space when the base integrated circuit die 436 is inserted into the encapsulation cavity 426. The concave or curved shape of the cavity sidewall 430 allows for larger non-orthogonal dies, devices, and packages to be inserted into the encapsulation cavity 426. Additional space is created from the terminal protrusion 424 extending to the encapsulation cavity 426. For example, a large integrated circuit or package body with upward sloping sidewalls can fit within the encapsulation cavity 426 but would not fit if the encapsulation cavity 426 had orthogonal sidewalls.

Figure 5:
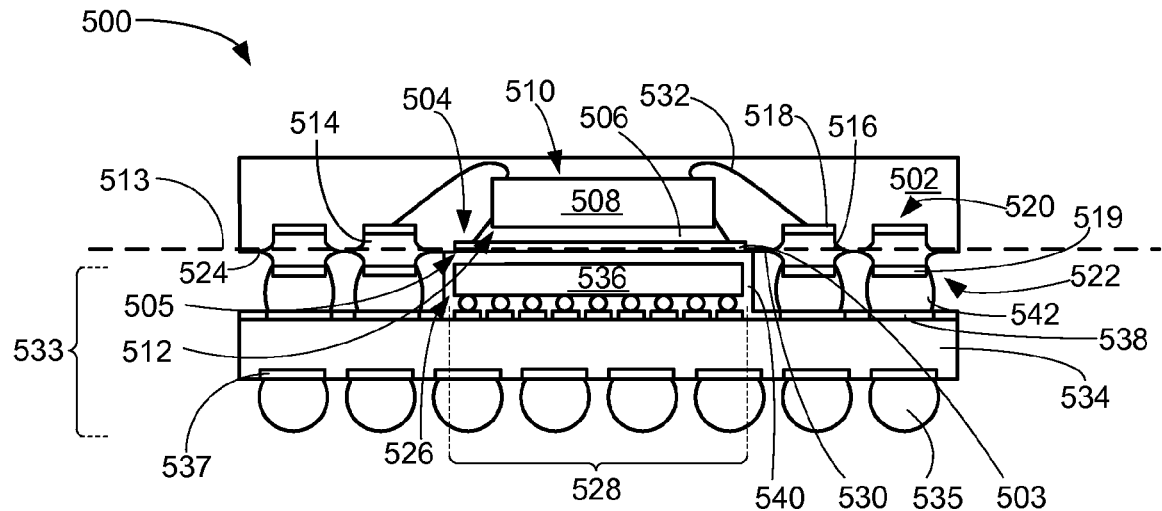
FIG. 5 is a cross-sectional view of an integrated circuit packaging system exemplified by the top view of FIG. 2 taken along line 1-1 of FIG. 2 in a fourth embodiment of the present invention.

Referring now to FIG. 5, therein is shown a cross-sectional view of an integrated circuit packaging system 500 exemplified by the top view of FIG. 2 taken along line 1-1 of FIG. 2 in a fourth embodiment of the present invention. The integrated circuit packaging system 500 can stack the integrated circuit packaging system 500 of FIG. 5 in a configuration for a package-on-package system.

The integrated circuit packaging system 500 is shown having an encapsulation 502, a mounting platform 503, an integrated circuit die 508, and a terminal 514. The encapsulation 502 covers the mounting platform 503, the integrated circuit die 508, and the terminal 514 and provides mechanical protection, environmental protection, and a hermetic seal for the integrated circuit packaging system 500. The encapsulation 502 can be made from an epoxy molding compound (EMC), film assisted molding, polymide compound, or a wire-in-film (WIF), as examples.

The integrated circuit packaging system 500 can include the mounting platform 503, which is defined as a structure for mounting components, dies, and devices. The mounting platform 503 can be made from metals including gold, silver, nickel, other conductive metal, or a combination thereof as examples.

The mounting platform 503 can include a platform top side 504 and a platform bottom side 505 opposite to the platform top side 504. The platform top side 504 of the mounting platform 503 can be embedded in the encapsulation 502. The integrated circuit die 508 can be mounted on the platform top side 504. The platform bottom side 505 can be exposed from the encapsulation 502. A horizontal plane 513 is coplanar with the platform bottom side 505 of the mounting platform 503.

An attach layer 506 can be applied to the platform top side 504 of the mounting platform 503. The attach layer 506 can include a die attach adhesive, an adhesive tape, an adhesive film, a thermally conductive material, an epoxy paste, or other adhesive as examples. The integrated circuit die 508 can be mounted to the mounting platform 503 using the attach layer 506.

The integrated circuit die 508 is embedded in the encapsulation 502. The integrated circuit die 508 is shown as a wire-bonded chip as an example. The integrated circuit die 508 can have an active side 510 and have a non-active side 512 opposite the active side 510. The non-active side 512 of the integrated circuit die 508 faces the mounting platform 503.

The terminal 514 can be formed in a number of rows surrounding and spaced from the integrated circuit die 508 and the mounting platform 503. As an example, a plurality of the terminal 514 is shown in two rows surrounding the integrated circuit die 508. The terminal 514 can include a terminal body 516, a top terminal layer 518, and a bottom terminal layer 519.

The terminal body 516 provides the base structure of the terminal 514 on which the top terminal layer 518 and the bottom terminal layer 519 can be formed. The terminal body 516 can be made from a variety of materials including copper, tin, zinc, other conductive metals, or metal alloy.

The top terminal layer 518 and the bottom terminal layer 519 can be formed on the terminal body 516 in a number of ways. For example, the top terminal layer 518 and the bottom terminal layer 519 can be formed by a process such as sputtering, electroplating, or chemical vapor deposition (CVD). The top terminal layer 518 and the bottom terminal layer can be made from metals including gold, silver, nickel, other conductive metal, or a combination thereof as examples.

The terminal 514 can include a terminal top side 520 and a terminal bottom side 522 opposite to the terminal top side 520. The top terminal layer 518 can be formed at the terminal top side 520 of the terminal body 516. The bottom terminal layer 519 can be formed at the terminal bottom side 522 of the terminal body 516. The top terminal layer 518 can be above the horizontal plane 513 of the mounting platform 503 as an example of the variable height configurations of the mounting platform 503.

The terminal body 516 can include a terminal protrusion 524 on a non-horizontal side of the terminal body 516. The terminal protrusion 524 extends from the top terminal layer 518 at the terminal top side 520 and extends from the bottom terminal layer 519 at the terminal bottom side 522 to form a tip at the non-horizontal side of the terminal body 516. The terminal protrusion 524 is shown below the horizontal plane 513 of the mounting platform 503.

The encapsulation 502 can include an encapsulation cavity 526. The encapsulation cavity 526 can expose the mounting platform 503 from the encapsulation 502. The encapsulation cavity 526 can have a cavity horizontal dimension 528, which is defined as the length and the width of the encapsulation cavity 526. The cavity horizontal dimension 528 can be greater than the length and the width of the integrated circuit die 508. For example, the encapsulation cavity 526 is shown having horizontal dimensions greater than the horizontal dimensions of the integrated circuit die 508.

The encapsulation cavity 526 can also have horizontal dimensions equal to the horizontal dimensions of the integrated circuit die 508. For example, the cavity horizontal dimension 528 can also be longer than the length of the integrated circuit die 508. The encapsulation cavity 526 can be bounded by a cavity sidewall 530 on a non-horizontal side of the encapsulation 502.

The cavity sidewall 530 can a non-planar portion. The non-planar portion can have a curved shape or grooved shape as the contour of the cavity sidewall 530. The contour of the cavity sidewall 530 can have characteristics of being formed from an etching process such as a curved or concave contour extending from the terminal protrusion 524 to the mounting platform 503. The terminal protrusion 524 at the terminal bottom side 522 can extend to the encapsulation cavity 526 along the cavity sidewall 530.

The integrated circuit packaging system 500 can include a chip interconnect 532. The chip interconnect 532 provides an electrical connection and can include a bond wire, a solder ball, or a solder pillar as examples. The chip interconnect 532 can connect the top terminal layer 518 at the terminal top side 520 to the active side 510 of the integrated circuit die 508. The chip interconnect 532 provides electrical connectivity from the terminal 514 to the integrated circuit die 508.

The bottom terminal layer 519 at the terminal bottom side 522 can be mounted to a base package 533. The base package 533 can include a base substrate 534, a system interconnect 535, and a base integrated circuit die 536. The base package 533 can include a flip chip base package.

The base substrate 534 can provide structural support and connectivity for other components and devices. The base substrate 534 can include a system contact pad 537 on a top surface of the base substrate 534. The base substrate 534 can include a mount contact pad 538 on a side of the base substrate 534 opposite to the system contact pad 537.

The system interconnect 535 can be attached to the system contact pad 537 on the bottom surface of the base substrate 534 for attaching the base package 533 to the next level system (not shown). The system interconnect 535 can include solder balls, solder dots, solder pillars, or a conductive bump as examples.

A mount interconnect 542 can attach the terminal 514 to the base substrate 534. The mount interconnect 542 provides a direct electrical and mechanical connection between the terminal 514 and the base substrate 534. The mount interconnect 542 can include solder paste, solder dots, or a conductive bump as examples.

The base integrated circuit die 536 can be mounted to the base substrate 534. The base integrated circuit die 536 is shown as a flip chip although the base integrated circuit die 536 can also be a wire-bonded chip. The base integrated circuit die 536 can be mounted to the base substrate 534 with solder balls, solder dots, or solder pillars for providing an electrically and physical connection between the base integrated circuit die 536 and the base substrate 534.

The base integrated circuit die 536 is shown with a length and width greater than the integrated circuit die 508 although it is understood that the base integrated circuit die 536 can be equal to or smaller than the horizontal dimensions of the integrated circuit die 508. The base integrated circuit die 536 can be positioned into the encapsulation cavity 526 with the cavity horizontal dimension 528 greater than the horizontal dimensions of the integrated circuit die 508. The integrated circuit die 508 can be suspended over the base integrated circuit die 536.

A base encapsulation 540 can cover the base integrated circuit die 536, the base substrate 534, and the area between the base integrated circuit die 536 and the base substrate 534. The base encapsulation 540 can include an epoxy molding compound (EMC), polymide compound, or a wire-in-film (WIF), as examples. The mount contact pad 538 can be exposed from the base encapsulation 540.

The base encapsulation 540 is shown having a length and a width greater than the length and the width of the integrated circuit die 508. The top surface of the base encapsulation 540 can be positioned within the encapsulation cavity 526 with the integrated circuit die 508 suspended over the base encapsulation 540.

The base encapsulation 540 is shown having orthogonal sidewalls although it is understood that the base encapsulation 540 can have other configurations for the sidewalls. For example, the sidewalls of the base encapsulation 540 can be sloped and not perpendicular to the base substrate 534. The base encapsulation 540 is shown in direct contact with the mounting platform 503, although it is understood that there can be a space between the base encapsulation 540 and the mounting platform 503. The encapsulation 502, the integrated circuit die 508, the terminal 514, and the base package 533 can form a package-on-package (PoP) device.

It has been discovered that the exposure of the mounting platform 503 from the encapsulation 502 provides airflow and cooling for the integrated circuit die 508. The encapsulation cavity 526 provides the platform bottom side 505 with exposure from the encapsulation 502. The integrated circuit packaging system 500 is thermally enhanced and the integrated circuit die 508 is cooled through the mounting platform 503 and the empty space provided by the encapsulation cavity 526.

Further, it has been discovered that the configuration of the terminal protrusion 524 below the horizontal plane 513 of the mounting platform 503 further increases airflow to the mounting platform 503. The placement of the mounting platform 503 in the encapsulation 502 also provides a variable height for the encapsulation cavity 526, which allows the integrated circuit die 508 and the mounting platform 503 to be spaced further from substrates and packages mounted to the terminal 514 for increased airflow and cooling.

Further, it has been discovered that the horizontal and vertical dimensions of the encapsulation cavity 526 and the placement of the integrated circuit die 508 in the encapsulation 502 leverages additional space in package-on-package applications. For example, the configuration of the terminal protrusion 524 below the horizontal plane 513 of the non-active side 512 provides for variable platform heights that allow different sized base chips and components, such as the base integrated circuit die 536 to fit in the encapsulation cavity 526. Further, the integrated circuit die 508 can share the same substrate as the base package 533 reducing package footprint and profile size. Further, the cavity horizontal dimension 528 provides for different sized components, dies, and packages that can be fitted into the encapsulation cavity 526.

It has also been discovered that the contour of the cavity sidewall 530 provides for more space when the base integrated circuit die 536 is inserted into the encapsulation cavity 526. The concave or curved shape of the cavity sidewall 530 allows for larger non-orthogonal dies, devices, and packages to be inserted into the encapsulation cavity 526. Additional space is created from the terminal protrusion 524 extending to the encapsulation cavity 526. For example, a large integrated circuit with upward sloping sidewalls can fit within the encapsulation cavity 526 but would not fit if the encapsulation cavity 526 had orthogonal sidewalls.

It has been discovered that the height of the mounting platform 503 with the terminal protrusion 524 below the horizontal plane 513 provides for chip cooling, for a lower package profile, and for shorter wire-loops for the chip interconnect 532. The positioning of the mounting platform 503 can be between the top terminal layer 518 and the terminal protrusion 524 for increasing cooling because the mounting platform 503 has more exposure from the encapsulation 502. The height of the mounting platform 503 provides a shorter distance between the integrated circuit die 508 and the top terminal layer 518 for shorter wire-loops, which increases the reliability of the electrical connection.

Figure 6:
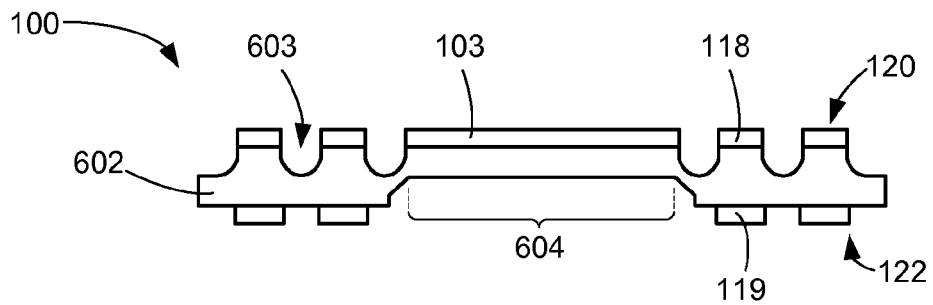
FIG. 6 is a cross-sectional view of the integrated circuit packaging system of FIG. 1 in a leadframe-providing phase of manufacture.

Referring now to FIG. 6, therein is shown a cross-sectional view of the integrated circuit packaging system 100 of FIG. 1 in a leadframe-providing phase of manufacture. A leadframe 602 can include a pre-plated leadframe (PPF) having the top terminal layer 118 at the terminal top side 120 and the bottom terminal layer 119 at the terminal bottom side 122. The leadframe 602 can include the mounting platform 103 between the top terminal layer 118 and another of the top terminal layer 118. The mounting platform 103 is coplanar to the top terminal layer 118.

The leadframe 602 can include a recess 603. The recess 603 can be formed through etching, stamping, or laser ablation, as examples. For example, the leadframe 602 can be etched at the terminal top side 120 before further processing. The leadframe 602 is provided with the top terminal layer 118, the bottom terminal layer 119, and the mounting platform 103 pre-plated. The top terminal layer 118 acts as an etch mask to resist an etching process at the terminal top side 120 of the leadframe 602. The leadframe 602 can be provided with the recess 603 between the areas covered by the top terminal layer 118 from an etching process.

The leadframe 602 can include a leadframe platform region 604, which is defined as a region of the leadframe 602 where the mounting platform 103 is plated. The mounting platform 103 is plated on the leadframe platform region 604 between the top terminal layer 118 and another of the top terminal layer 118. The leadframe platform region 604 can be formed by stamping, etching, or laser ablation as examples. For example, the leadframe 602 can be partially etched at the terminal bottom side 122 for forming the leadframe platform region 604. After etching of the leadframe platform region 604 at the terminal bottom side 122, the thickness of the leadframe 602 at the leadframe platform region 604 can be equal to the thickness of the leadframe 602 between the base of the recess 603 and the terminal bottom side 122.

Figure 7:
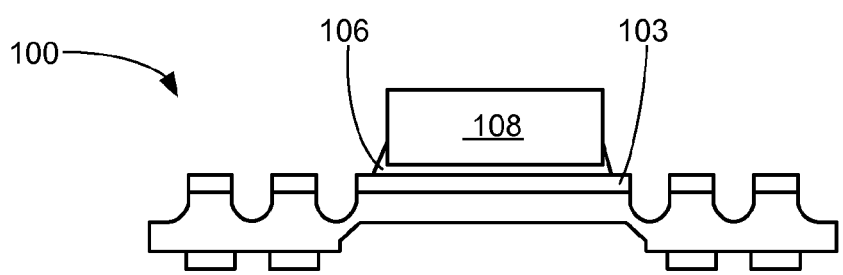
FIG. 7 is the structure of FIG. 6 in a die-mounting phase.

Referring now to FIG. 7, therein is shown the structure of FIG. 6 in a die-mounting phase. The attach layer 106 can be applied directly to the mounting platform 103. The integrated circuit die 108 can be mounted on the attach layer 106 with the attach layer 106 adhering the integrated circuit die 108 to the mounting platform 103.

Figure 8:
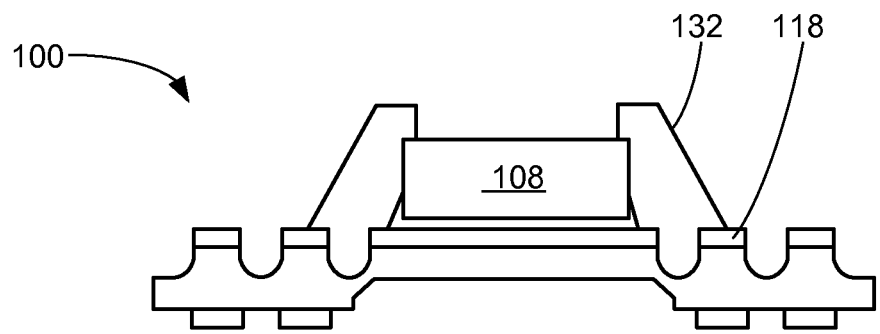
FIG. 8 is the structure of FIG. 7 in a wire-attachment phase.

Referring now to FIG. 8, therein is shown the structure of FIG. 7 in a wire-attachment phase. The chip interconnect 132 can be wire-bonded between the integrated circuit die 108 and the top terminal layer 118 for providing an electrical connection.

Figure 9:
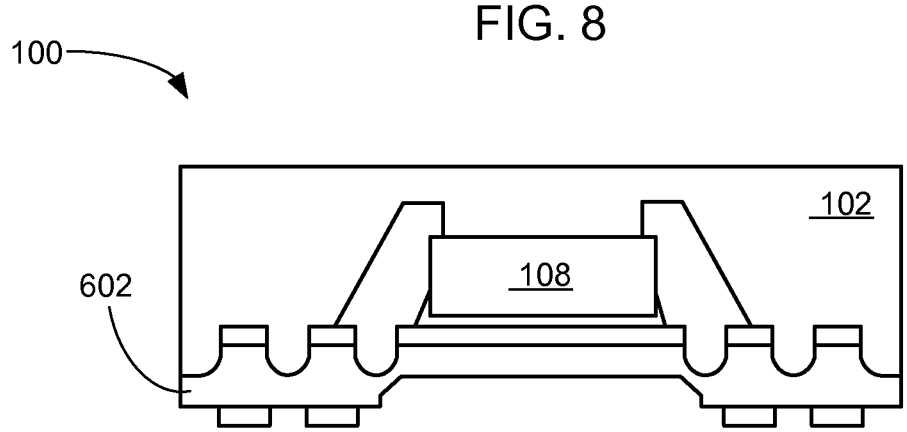
FIG. 9 is the structure of FIG. 8 in a leadframe-encapsulation phase.

Referring now to FIG. 9, therein is shown the structure of FIG. 8 in a leadframe-encapsulation phase. The encapsulation 102 is formed to cover the mounting platform 103, the integrated circuit die 108, the chip interconnect 132, and the leadframe 602.

Figure 10:
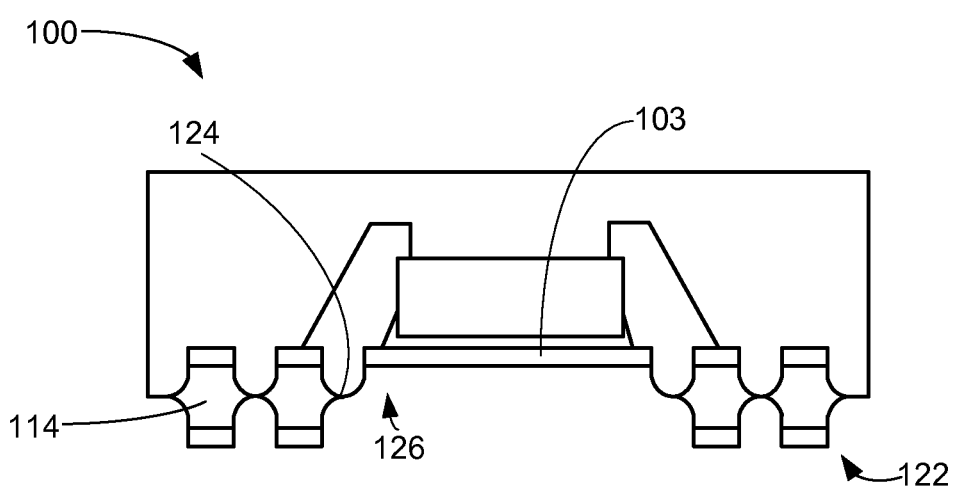
FIG. 10 is the structure of FIG. 9 in a terminal-formation phase.

Referring now to FIG. 10, therein is shown the structure of FIG. 10 in a terminal-formation phase. The leadframe 602 of FIG. 9 can be further processed for forming a plurality of the terminal 114. The leadframe 602 can be processed through various methods including etching, drilling, or cutting as examples.

For example, the leadframe 602 can be etched at the terminal bottom side 122 for fully isolating the terminal 114 from another of the terminal 114. After the terminal-formation step, the terminal protrusion 124 can be formed between terminals. The terminal protrusion 124 can be formed from the junction of the curved corners formed by the etching process on the non-horizontal side of the terminal 114.

The leadframe platform region 604 of FIG. 6 can be removed for exposing the mounting platform 103 from the encapsulation 102 of FIG. 1. The leadframe platform region 604 can be removed in a number of ways. For example, the leadframe platform region 604 can be removed by etching, grinding, and laser ablation as examples. The removal of the leadframe platform region 604 creates the encapsulation cavity 126 at the encapsulation bottom surface 101 of FIG. 1. The encapsulation 102 separates the terminal 114 from contact with the mounting platform 103 after the removal process.

The formation of the terminal 114 and the removal of the leadframe platform region 604 can be formed in a single etching process because the thickness of the leadframe 602 at the leadframe platform region 604 is equal to the thickness of the leadframe 602 between the base of the recess 603 of FIG. 6 and the terminal bottom side 122. For example, a single etching process can remove the leadframe platform region 604 for exposing the mounting platform 103 and can also isolate the terminal 114 from another of the terminal 114.

It has been discovered that the exposure of the mounting platform 103 from the encapsulation 102 of FIG. 1 provides airflow and cooling for the integrated circuit die 108 of FIG. 1. The encapsulation cavity 126 provides the platform bottom side 105 of FIG. 1 with exposure from the encapsulation 102. The integrated circuit packaging system 100 is thermally enhanced and the integrated circuit die 108 is cooled through the mounting platform 103 and the empty space provided by the encapsulation cavity 126.

Further, it has been discovered that the configuration of the terminal protrusion 124 below the horizontal plane 113 of FIG. 1 of the mounting platform 103 further increases airflow to the mounting platform 103. The placement of the mounting platform 103 in the encapsulation 102 also provides a variable height for the encapsulation cavity 126, which allows the integrated circuit die 108 and the mounting platform 103 to be spaced further from substrates and packages mounted to the terminal 114 for increased airflow and cooling.

It has been discovered that the thickness of the leadframe 602 at the leadframe platform region 604 provides for both the removal of the leadframe platform region 604 and the formation of the terminal 114 in a single etching process step. The thickness of the leadframe 602 at the leadframe platform region 604 can equal to the thickness of the leadframe 602 between the base of the recess 603 and the terminal bottom side 122. The single etching process step increases manufacturing speed by reducing process steps.

Figure 11:
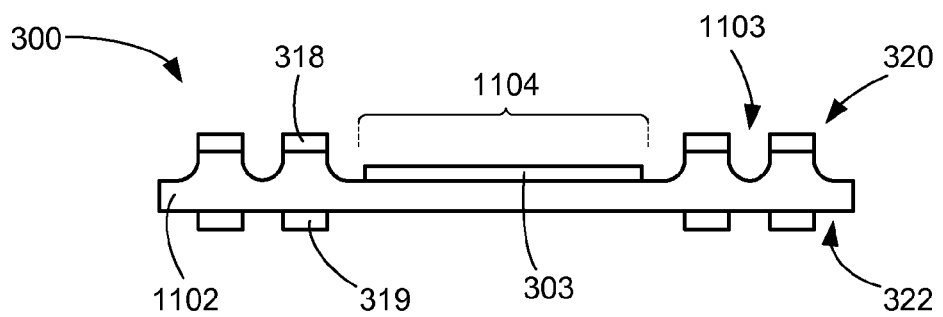
FIG. 11 is cross-sectional view of the integrated circuit packaging system of FIG. 3 in a leadframe-providing phase of manufacture.

Referring now to FIG. 11, therein is shown a cross-sectional view of the integrated circuit packaging system 300 of FIG. 3 in a leadframe-providing phase of manufacture. A leadframe 1102 can include a pre-plated leadframe (PPF) having the top terminal layer 318 at the terminal top side 320 and the bottom terminal layer 319 at the terminal bottom side 322. The leadframe 1102 can include the mounting platform 303 between the top terminal layer 318 and another of the top terminal layer 318.

The leadframe 1102 can include a recess 1103. The recess 1103 can be formed through etching, stamping, or laser ablation, as examples. For example, the leadframe 1102 can be etched at the terminal top side 320 before further processing. The leadframe 1102 is provided with the top terminal layer 318, and the bottom terminal layer 319 pre-platted. The top terminal layer 318 acts as an etch mask to resist an etching process at the terminal top side 320 of the leadframe 1102. The leadframe 1102 can be provided with the recess 1103 between the areas covered by the top terminal layer 318 from an etching process.

The leadframe 1102 can include a leadframe platform region 1104, which is defined as a region of the leadframe 1102 where the mounting platform 303 is plated. The mounting platform 303 is plated on the leadframe platform region 1104 between the top terminal layer 318 and another of the top terminal layer 318. The leadframe platform region 1104 can be formed by stamping, etching, or laser ablation as examples. For example, the leadframe 1102 can be etched at the terminal top side 320 of the leadframe 1102 for forming the leadframe platform region 1104.

After etching, the leadframe platform region 1104 has a depth equal to the recess 1103. The mounting platform 303 can be plated on the leadframe platform region 1104 after the etching process. The thickness of the leadframe 1102 at the leadframe platform region 1104 is equal to the thickness of the leadframe 1102 between the base of the recess 1103 and the terminal bottom side 322.

Figure 12:
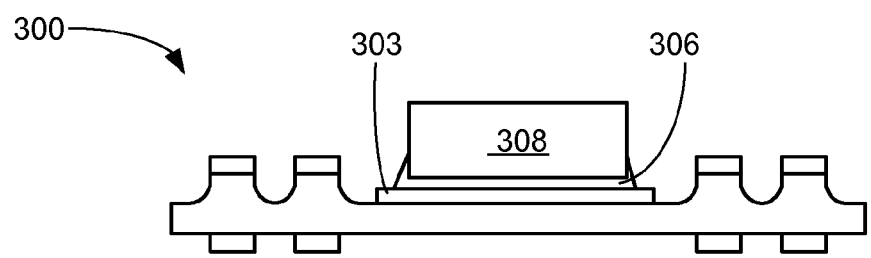
FIG. 12 is the structure of FIG. 11 in a die-mounting phase.

Referring now to FIG. 12, therein is shown the structure of FIG. 11 in the die-mounting phase. The attach layer 306 can be applied to the mounting platform 303. The integrated circuit die 308 can be mounted on the attach layer 306 with the attach layer 306 adhering the integrated circuit die 308 to the mounting platform 303.

Figure 13:
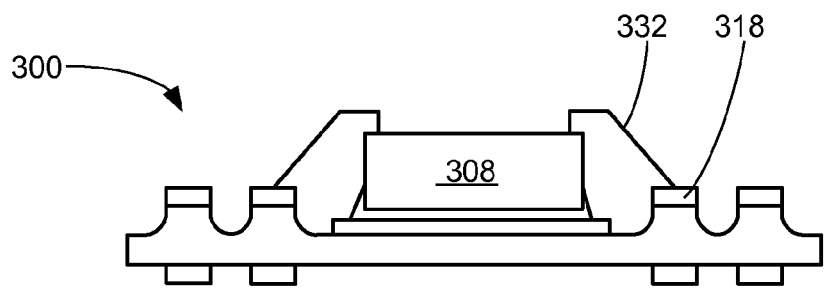
FIG. 13 is the structure of FIG. 12 in a wire-attachment phase.

Referring now to FIG. 13, therein is shown the structure of FIG. 12 in a wire-attachment phase. The chip interconnect 332 can be wire-bonded between the integrated circuit die 308 and the top terminal layer 318 for providing an electrical connection.

Figure 14:
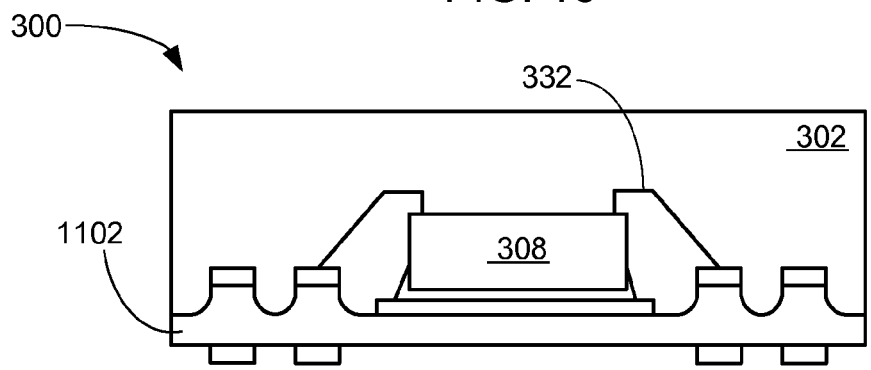
FIG. 14 is the structure of FIG. 13 in a leadframe-encapsulation phase.

Referring now to FIG. 14, therein is shown the structure of FIG. 13 in a leadframe-encapsulation phase. The encapsulation 302 is formed to cover the mounting platform 303, the integrated circuit die 308, the chip interconnect 332, and the leadframe 1102.

Figure 15:
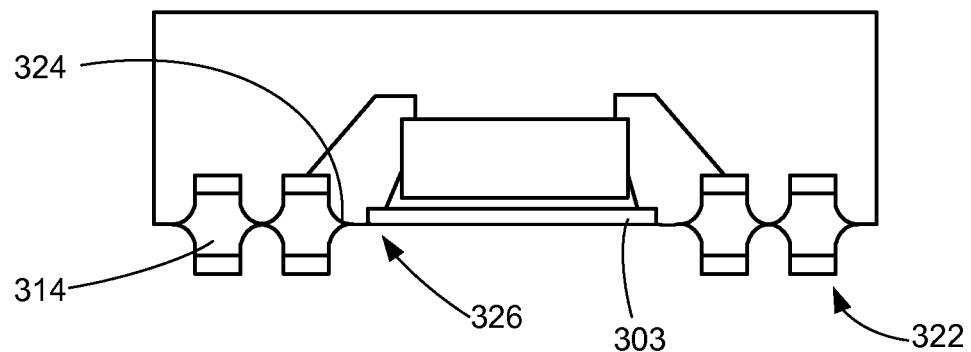
FIG. 15 is the structure of FIG. 14 in a terminal-formation phase.

Referring now to FIG. 15, therein is shown the structure of FIG. 14 in a terminal-formation phase. The leadframe 1102 of FIG. 14 can be further processed for forming a plurality of the terminal 314. The leadframe 1102 can be processed through various methods including etching, drilling, or cutting as examples.

For example, the leadframe 1102 can be etched at the terminal bottom side 322 for fully isolating the terminal 314 from another of the terminal 314. After the terminal-formation step, the terminal protrusion 324 can be formed between terminals. The terminal protrusion 324 can be formed from the junction of the curved corners formed by the etching process on the non-horizontal side of the terminal 314.

The leadframe platform region 1104 of FIG. 11 can be removed for exposing the mounting platform 303 from the encapsulation 302 of FIG. 3. The leadframe platform region 1104 can be removed in a number of ways. For example, the leadframe platform region 1104 can be removed by etching, grinding, and laser ablation as examples. The removal of the leadframe platform region 1104 creates the encapsulation cavity 326.

The formation of the terminal 314 and the removal of the leadframe platform region 1104 can be formed in a single etching process because the thickness of the leadframe 1102 at the leadframe platform region 1104 is equal to the thickness of the leadframe 1102 between the base of the recess 1103 of FIG. 11 and the terminal bottom side 322. For example, a single etching process can remove the leadframe platform region 1104 for exposing the mounting platform 303 and can isolate the terminal 314 from another of the terminal 314.

It has been discovered that the exposure of the mounting platform 303 from the encapsulation 302 of FIG. 3 provides airflow and cooling for the integrated circuit die 308 of FIG. 3. The encapsulation cavity 326 provides the platform bottom side 305 of FIG. 3 with exposure from the encapsulation 302. The integrated circuit packaging system 300 is thermally enhanced and the integrated circuit die 308 is cooled through the mounting platform 303 and the empty space provided by the encapsulation cavity 326.

Further, it has been discovered that the configuration of the terminal protrusion 324 below the horizontal plane 313 of FIG. 3 of the mounting platform 303 further increases airflow to the mounting platform 303. The placement of the mounting platform 303 in the encapsulation 302 also provides a variable height for the encapsulation cavity 326, which allows the integrated circuit die 308 and the mounting platform 303 to be spaced further from substrates and packages mounted to the terminal 314 for increased airflow and cooling.

It has also been discovered that the thickness of the leadframe 1102 at the leadframe platform region 1104 provides for both the removal of the leadframe platform region 1104 and the formation of the terminal 314 in a single etching process step. The thickness of the leadframe 1102 at the leadframe platform region 1104 is equal to the thickness of the leadframe 1102 between the base of the recess 1103 and the terminal bottom side 122. The single etching process step increases manufacturing speed by reduces process steps.

Figure 16:
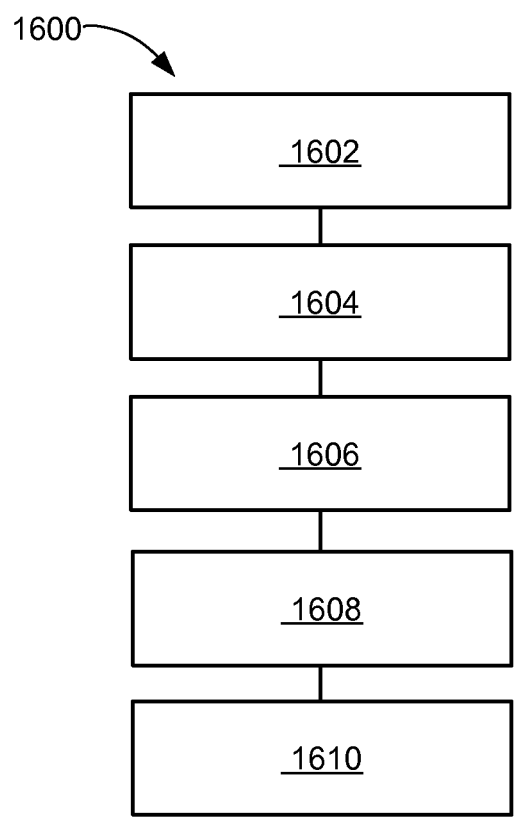
FIG. 16 is a flow chart of a method of manufacture of the integrated circuit packaging system in a further embodiment of the present invention.

Referring now to FIG. 16, therein is shown a flow chart of a method 1600 of manufacture of the integrated circuit packaging system in a further embodiment of the present invention. The method 1600 includes: providing a leadframe having a mounting platform in a block 1602; applying an attach layer on the mounting platform in a block 1604; mounting an integrated circuit die on the attach layer in a block 1606; forming an encapsulation on the integrated circuit die and the attach layer, the mounting platform exposed from the encapsulation in a block 1808; and forming a terminal having a terminal protrusion from the leadframe, the terminal protrusion below a horizontal plane of the mounting platform in a block 1610.

Thus, it has been discovered that the integrated circuit packaging system of the present invention furnishes important and heretofore unknown and unavailable solutions, capabilities, and functional aspects for mold interlock. The resulting method, process, apparatus, device, product, and/or system is straightforward, cost-effective, uncomplicated, highly versatile and effective, can be surprisingly and non-obviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a leadframe, of a first metal, having a leadframe platform region;
   forming a mounting platform on the leadframe platform region by depositing the mounting platform, of a second metal, on the leadframe platform region;
   applying an attach layer directly on the mounting platform;
   mounting an integrated circuit die on the attach layer, the attach layer completely covering a non-active side of the integrated circuit die;
   forming an encapsulation on the integrated circuit die and the attach layer;
   etching the leadframe platform region, to completely remove the first metal, for exposing an entire area of the second metal as a platform bottom side of the mounting platform from the encapsulation and for forming an encapsulation cavity at an encapsulation bottom surface of the encapsulation; and forming a terminal having a terminal protrusion from the leadframe, the terminal protrusion below the platform bottom side of the mounting platform and the encapsulation separating the terminal from contact with the mounting platform; wherein the first metal is different from the second metal.

2. The method as claimed in claim 1 wherein:
forming the terminal includes forming a top terminal layer; and
providing the leadframe includes providing the mounting platform coplanar to the top terminal layer.

3. The method as claimed in claim 1 wherein forming the encapsulation includes forming the encapsulation cavity having a cavity horizontal dimension larger than a die horizontal dimension.

4. The method as claimed in claim 1 further comprising:
providing a base substrate;
mounting a base integrated circuit die to the base substrate; and
mounting the base substrate to the terminal with the base integrated circuit die below the integrated circuit die.

5. A method of manufacture of an integrated circuit packaging system comprising:
providing a leadframe, of a first metal, having a leadframe platform region;
forming a mounting platform on the leadframe platform region by depositing the mountings platform, of a second metal, on the leadframe platform region;
applying an attach layer directly on the mounting platform;
mounting an integrated circuit die on the attach layer, the attach layer completely covering a non-active side of the integrated circuit die;
forming an encapsulation on the integrated circuit die and the attach layer;
etching the leadframe platform region, to completely remove the first metal, for exposing an entire area of the second metal as a platform bottom side of the mounting platform from the encapsulation and for forming an encapsulation cavity at an encapsulation bottom surface, the encapsulation cavity shaped by the leadframe platform region; and
removing portions of the leadframe for forming a terminal having a terminal protrusion, the terminal protrusion extends below the platform bottom side of the mounting platform and the encapsulation separating the terminal from contact with the mounting platform; wherein the first metal is different from the second metal.

6. The method as claimed in claim 5 further comprising connecting a chip interconnect between the integrated circuit die and the terminal.

7. The method as claimed in claim 5 wherein forming the terminal includes forming the terminal partially in the encapsulation with only a portion of the terminal at a terminal bottom side exposed from the encapsulation.

8. The method as claimed in claim 5 wherein forming the encapsulation cavity includes forming a cavity sidewall extending to the terminal protrusion.

* * * * *